United States Patent
Mazany (10) Patent No.: US 10,941,486 B2
(45) Date of Patent: Mar. 9, 2021

(54) HIGH TEMPERATURE OXIDATION PROTECTION FOR COMPOSITES

(71) Applicant: Goodrich Corporation, Charlotte, NC (US)

(72) Inventor: Anthony M. Mazany, Amelia Island, FL (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 16/589,368

(22) Filed: Oct. 1, 2019

(65) Prior Publication Data

US 2020/0032391 A1 Jan. 30, 2020

Related U.S. Application Data

(62) Division of application No. 15/169,219, filed on May 31, 2016, now Pat. No. 10,465,285.

(51) Int. Cl.
| | | |
|---|---|---|
| *C23C 16/44* | (2006.01) | |
| *C04B 41/52* | (2006.01) | |
| *C04B 41/00* | (2006.01) | |
| *C04B 41/89* | (2006.01) | |
| *C23C 4/12* | (2016.01) | |
| *C04B 111/00* | (2006.01) | |

(52) U.S. Cl.
CPC ............ *C23C 16/44* (2013.01); *C04B 41/009* (2013.01); *C04B 41/52* (2013.01); *C04B 41/89* (2013.01); *C23C 4/12* (2013.01); *C04B 2111/00362* (2013.01)

(58) Field of Classification Search
None
See application file for complete search history.

(56) References Cited

U.S. PATENT DOCUMENTS

| | | |
|---|---|---|
| 2,685,539 A | 8/1954 | Woodburn, Jr. et al. |
| 2,685,540 A | 8/1954 | Woodburn, Jr. et al. |
| 2,685,541 A | 8/1954 | Woodburn, Jr. et al. |
| 2,685,542 A | 8/1954 | Woodburn, Jr. et al. |
| 2,989,153 A | 6/1961 | Boulet et al. |

(Continued)

FOREIGN PATENT DOCUMENTS

| | | |
|---|---|---|
| CN | 1046517 | 10/1990 |
| CN | 102515850 | 6/2012 |

(Continued)

OTHER PUBLICATIONS

USPTO, Final Office Action dated Sep. 9, 2020 in U.S. Appl. No. 15/886,671.

(Continued)

*Primary Examiner* — John J Figueroa
(74) *Attorney, Agent, or Firm* — Snell & Wilmer L.L.P.

(57) ABSTRACT

The present disclosure provides a method for coating a composite structure, comprising applying a first slurry on a surface of the composite structure, heating the composite structure to a temperature sufficient to form a base layer on the composite structure, forming a sealing slurry comprising at least one of acid aluminum phosphate or orthophosphoric acid, applying the sealing slurry to the base layer, and heating the composite structure to a second temperature sufficient to form a sealing layer on the base layer.

20 Claims, 6 Drawing Sheets

(56) References Cited

U.S. PATENT DOCUMENTS

| | | | |
|---|---|---|---|
| 3,342,627 A | 9/1967 | Paxton et al. | |
| 3,510,347 A | 5/1970 | Strater | |
| 3,692,150 A | 9/1972 | Ruppe, Jr. | |
| 3,713,882 A | 1/1973 | DeBrunner et al. | |
| 3,794,509 A | 2/1974 | Trauger et al. | |
| 3,972,395 A | 8/1976 | Jannasch et al. | |
| 4,290,510 A | 9/1981 | Warren | |
| 4,330,572 A | 5/1982 | Frosch et al. | |
| 4,332,856 A | 6/1982 | Hsu | |
| 4,425,407 A | 1/1984 | Galasso et al. | |
| 4,439,491 A | 3/1984 | Wilson | |
| 4,454,193 A * | 6/1984 | Block | C04B 41/009 427/113 |
| 4,471,023 A | 9/1984 | Shuford | |
| 4,500,602 A | 2/1985 | Patten et al. | |
| 4,548,957 A | 10/1985 | Hucke | |
| 4,567,103 A | 1/1986 | Sara | |
| 4,617,232 A | 10/1986 | Chandler et al. | |
| 4,621,017 A | 11/1986 | Chandler et al. | |
| 4,663,060 A | 5/1987 | Holinski | |
| 4,702,960 A | 10/1987 | Ogman | |
| 4,711,666 A | 12/1987 | Chapman et al. | |
| 4,726,995 A | 2/1988 | Chiu | |
| 4,760,900 A | 8/1988 | Shima et al. | |
| 4,837,073 A | 6/1989 | McAllister et al. | |
| 4,863,001 A | 9/1989 | Edmisten | |
| 4,892,790 A | 1/1990 | Gray | |
| 4,958,998 A | 9/1990 | Yamauchi et al. | |
| 5,073,454 A | 12/1991 | Graham | |
| 5,077,130 A | 12/1991 | Okuyama et al. | |
| 5,094,901 A | 3/1992 | Gray | |
| 5,102,698 A | 4/1992 | Cavalier et al. | |
| 5,153,070 A | 10/1992 | Andrus et al. | |
| 5,198,152 A | 3/1993 | Liimatta et al. | |
| 5,215,563 A | 6/1993 | LaCourse et al. | |
| 5,224,572 A | 7/1993 | Smolen et al. | |
| 5,242,746 A | 9/1993 | Bommier et al. | |
| 5,256,448 A | 10/1993 | De Castro | |
| 5,273,819 A | 12/1993 | Jex | |
| 5,298,311 A | 3/1994 | Bentson et al. | |
| 5,324,541 A | 6/1994 | Shuford | |
| 5,401,440 A | 3/1995 | Stover et al. | |
| 5,427,823 A | 6/1995 | Varshney et al. | |
| 5,439,080 A | 8/1995 | Haneda et al. | |
| 5,501,306 A | 3/1996 | Martino | |
| 5,518,683 A | 5/1996 | Taylor et al. | |
| 5,518,816 A | 5/1996 | Shuford | |
| 5,536,574 A | 7/1996 | Carter | |
| 5,622,751 A | 4/1997 | Thebault et al. | |
| 5,629,101 A | 5/1997 | Watremez | |
| 5,643,663 A | 7/1997 | Bommier et al. | |
| 5,682,596 A | 10/1997 | Taylor et al. | |
| 5,686,144 A | 11/1997 | Thebault et al. | |
| 5,714,244 A | 2/1998 | Delaval et al. | |
| 5,725,955 A | 3/1998 | Tawil et al. | |
| 5,759,622 A | 6/1998 | Stover | |
| 5,871,820 A | 2/1999 | Hasz et al. | |
| 5,878,843 A | 3/1999 | Saum | |
| 5,878,849 A | 3/1999 | Prunier, Jr. et al. | |
| 5,901,818 A | 5/1999 | Martino | |
| 5,958,846 A | 9/1999 | Geriner | |
| 5,971,113 A | 10/1999 | Kesavan et al. | |
| 5,981,072 A | 11/1999 | Mercuri et al. | |
| 6,016,450 A | 1/2000 | Corck | |
| 6,036,762 A | 3/2000 | Sambasivan | |
| 6,071,603 A | 6/2000 | Sakai et al. | |
| 6,331,362 B1 | 12/2001 | Dupel et al. | |
| 6,346,331 B2 | 2/2002 | Harvey et al. | |
| 6,460,374 B2 | 10/2002 | Sakai et al. | |
| 6,461,415 B1 | 10/2002 | Sambasivan et al. | |
| 6,497,307 B1 | 12/2002 | Schoo et al. | |
| 6,551,701 B1 | 4/2003 | Nohr et al. | |
| 6,551,709 B1 | 4/2003 | Stover | |
| 6,555,173 B1 | 4/2003 | Forsythe et al. | |
| 6,668,984 B2 | 12/2003 | Gray | |
| 6,737,120 B1 | 5/2004 | Golecki | |
| 6,884,467 B2 | 4/2005 | Walker et al. | |
| 6,896,968 B2 | 5/2005 | Golecki | |
| 6,913,821 B2 | 7/2005 | Golecki et al. | |
| 6,969,422 B2 | 11/2005 | Mazany et al. | |
| 7,011,888 B2 | 3/2006 | Bauer et al. | |
| 7,118,805 B2 | 10/2006 | Walker et al. | |
| 7,311,944 B2 | 12/2007 | Sambasivan et al. | |
| 7,501,181 B2 | 3/2009 | Walker et al. | |
| 7,641,941 B2 | 1/2010 | Mazany et al. | |
| 7,732,358 B2 | 6/2010 | Mazany et al. | |
| 7,785,712 B2 | 8/2010 | Miller et al. | |
| 7,938,877 B2 | 5/2011 | Liu et al. | |
| 7,968,192 B2 | 6/2011 | Mazany et al. | |
| 8,021,474 B2 | 9/2011 | Mazany et al. | |
| 8,021,758 B2 | 9/2011 | Sambasivan et al. | |
| 8,124,184 B2 | 2/2012 | Sambasivan et al. | |
| 8,322,754 B2 | 12/2012 | Carcagno et al. | |
| 8,962,083 B2 | 2/2015 | Murphy | |
| 9,126,873 B2 | 9/2015 | Diss et al. | |
| 9,758,678 B2 | 9/2017 | Nicolaus et al. | |
| 9,790,133 B2 * | 10/2017 | Mazany | B05D 3/104 |
| 2002/0058576 A1 | 5/2002 | Mazany et al. | |
| 2002/0096407 A1 | 7/2002 | Gray | |
| 2002/0123592 A1 | 9/2002 | Zhang | |
| 2003/0143436 A1 | 7/2003 | Forsythe et al. | |
| 2004/0038032 A1 | 2/2004 | Walker et al. | |
| 2004/0038043 A1 | 2/2004 | Golecki | |
| 2004/0213906 A1 | 10/2004 | Mazany et al. | |
| 2005/0022698 A1 | 2/2005 | Mazany et al. | |
| 2006/0159909 A1 | 7/2006 | Asian | |
| 2007/0154712 A1 | 7/2007 | Mazany et al. | |
| 2008/0142148 A1 | 6/2008 | Mazany | |
| 2008/0311301 A1 | 12/2008 | Diss et al. | |
| 2010/0266770 A1 | 10/2010 | Mazany et al. | |
| 2011/0311804 A1 | 12/2011 | Diss | |
| 2013/0022826 A1 | 1/2013 | Kmetz | |
| 2014/0196502 A1 | 7/2014 | Masuda | |
| 2014/0227511 A1 * | 8/2014 | Mazany | C04B 41/5022 428/323 |
| 2014/0349016 A1 | 11/2014 | Don | |
| 2015/0183998 A1 | 7/2015 | Belov et al. | |
| 2015/0291805 A1 | 10/2015 | Nicolaus et al. | |
| 2015/0362029 A1 | 12/2015 | Edwards et al. | |
| 2016/0122231 A1 | 5/2016 | Ishihara | |
| 2016/0280585 A1 * | 9/2016 | Mazany | C23D 3/00 |
| 2016/0280612 A1 | 9/2016 | Mazany | |
| 2017/0036945 A1 | 2/2017 | Ishihara | |
| 2017/0267595 A1 * | 9/2017 | Mazany | C03C 3/19 |
| 2017/0342555 A1 | 11/2017 | Mazany | |
| 2017/0349825 A1 | 12/2017 | Mazany | |
| 2017/0369713 A1 * | 12/2017 | Poteet | C09D 5/084 |
| 2017/0369714 A1 | 12/2017 | Nicholaus | |

FOREIGN PATENT DOCUMENTS

| | | |
|---|---|---|
| CN | 101712563 | 9/2012 |
| CN | 103274760 | 9/2013 |
| CN | 105237039 | 1/2016 |
| CN | 107935634 | 4/2018 |
| EP | 200568 | 11/1986 |
| EP | 0677499 | 10/1995 |
| EP | 1043290 | 10/2000 |
| EP | 1693262 | 8/2006 |
| EP | 1834937 | 9/2007 |
| EP | 1968914 | 7/2010 |
| EP | 2684752 | 1/2014 |
| EP | 2767529 | 8/2014 |
| EP | 2774900 | 9/2014 |
| EP | 2930162 | 10/2015 |
| EP | 3072865 | 9/2016 |
| EP | 3072866 | 9/2016 |
| EP | 3222602 | 9/2017 |
| EP | 3282038 | 2/2018 |
| EP | 3530637 | 8/2019 |
| GB | 2468378 | 9/2010 |
| JP | 09301786 | 11/1997 |
| JP | 2006036551 | 2/2006 |
| KR | 20050022947 | 3/2005 |

(56) References Cited

FOREIGN PATENT DOCUMENTS

| WO | WO 9742135 | 11/1997 |
|---|---|---|
| WO | WO 0051950 | 9/2000 |
| WO | 03084899 | 10/2003 |
| WO | WO 2007078419 | 7/2007 |
| WO | WO 2014035413 | 3/2014 |
| WO | WO 2015169024 | 11/2015 |

OTHER PUBLICATIONS

USPTO, Non-Final Office Action dated Oct. 29, 2020 in U.S. Appl. No. 16/666,809.
International Search Report and Written Opinion dated Apr. 20, 2005 in Application No. PCT/US2004/012222.
International Preliminary Report on Patentability dated Aug. 18, 2005 in Application No. PCT/US2004/012222.
International Search Report and Written Opinion dated Jul. 3, 2007 in Application No. PCT/US2006/043343.
Office Action dated Jan. 4, 2008 in Application No. 04816727.4.
Office Action dated Feb. 26, 2008 in U.S. Appl. No. 10/829,144.
International Preliminary Report on Patentability dated Mar. 12, 2008 in Application No. PCT/US2006/043343.
Final Office Action dated Jul. 16, 2008 in U.S. Appl. No. 10/829,144.
Office Action dated Oct. 24, 2008 in U.S. Appl. No. 10/829,144.
Communication Pursuant to Article 94(3) EPC dated Oct. 28, 2008 in European Application No. 06837063.4.
Restriction Requirement dated Feb. 5, 2009 in U.S. Appl. No. 11/315,592.
Final Office Action dated Jan. 29, 2009 in U.S. Appl. No. 10/829,144.
Communication Pursuant to Article 94(3) EPC dated Feb. 9, 2009 in European Application No. 06837063.4.
Office Action dated May 29, 2009 in U.S. Appl. No. 10/829,144.
Office Action dated Jun. 9, 2009 in U.S. Appl. No. 11/315,592.
Notice of Allowance dated Oct. 1, 2009 in U.S. Appl. No. 10/829,144.
Final Office Action dated Dec. 11, 2009 in U.S. Appl. No. 11/315,592.
Communication under Rule 71(3) EPC dated Feb. 4, 2010 in European Application No. 06837063.4.
Advisory Action dated Feb. 25, 2010 in U.S. Appl. No. 11/315,592.
Office Action dated Apr. 1, 2010 in U.S. Appl. No. 11/315,592.
Partial European Search Report dated Oct. 29, 2010 in European Application No. 10169627.6.
Office Action dated Feb. 4, 2011 in U.S. Appl. No. 12/619,061.
Office Action dated Feb. 22, 2011 in U.S. Appl. No. 12/829,178.
Extended European Search Report dated May 4, 2011 in European Application No. 10169627.6.
Final Office Action dated Aug. 19, 2011 in U.S. Appl. No. 12/829,178.
Advisory Action dated Oct. 27, 2011 in U.S. Appl. No. 12/829,178.
U.S. Appl. No. 15/076,348, filed Mar. 21, 2016 titled "High Temperature Oxidation Protection for Composites," 42 pages.
U.S. Appl. No. 15/169,219, filed May 31, 2016 titled "High Temperature Oxidation Protection for Composites," 37 pages.
U.S. Appl. No. 15/169,257, filed May 31, 2016 titled "High Temperature Oxidation Protection for Composites," 40 pages.
U.S. Appl. No. 15/174,537, filed Jun. 6, 2016 titled "Nanocomposite Coatings for Oxidation Protection for Composites," 44 pages.
U.S. Appl. No. 15/194,034, filed Jun. 27, 2016 titled "High Temperature Oxidation Protection for Composites," 49 pages.
U.S. Appl. No. 15/234,903, filed Aug. 11, 2016 titled "High Temperature Oxidation Protection for Composites," 41 pages.
U.S. Appl. No. 15/380,442, filed Dec. 15, 2016 titled "High Temperature Oxidation Protection for Composites," 41 pages.
Extended European Search Report dated Jul. 26, 2016 in European Application No. 16161832.7.
Restriction Requirement dated Nov. 7, 2016 in U.S. Appl. No. 14/671,637.
Preinterview First Office Action dated Mar. 6, 2017 in U.S. Appl. No. 14/671,637.
First Action Interview Office Action dated May 12, 2017 in U.S. Appl. No. 14/671,637.
Restriction Requirement dated Jan. 5, 2018 in U.S. Appl. No. 15/076,348.
Extended European Search Report dated Aug. 2, 2017 in European Application No. 17159538.2.
Rovner; "A Haven for Glass, Ceramics"; Science & Technology; May 24, 2004; pp. 33-39.
Air Products and Chemicals, Inc., "Complete Product Offering," 4 pages, retrieved from www.airproducts.com on Jun. 28, 2004.
McKee, Chemistry and Physics of Carbon, vol. 16, P.L. Walker and P.A. Thrower eds., Marcel Dekker, 1981, p. 30-42.
Sosman, "The Common Refractory Oxides," The Journal of Industrial and Engineering Chemistry, vol. 8, No. 11, Nov. 1916, pp. 985-990.
Almatis Website, C-333, Accessed Feb. 8, 2011, p. 1.
Montedo et al., Crystallisation Kinetics of a B-Spodumene-Based Glass Ceramic, Advances in Materials Science and Engineering, pp. 1-9, vol. 2012, Article ID 525428, Hindawi Publishing Corporation.
Extended European Search Report dated Oct. 9, 2017 in European Application No. 17173709.1.
Extended European Search Report dated Oct. 17, 2017 in European Application No. 17173707.5.
Sun Lee W et al., "Comparative study of thermally conductive fillers in underfill for the electronic components", Diamond and Related Materials, Elsevier Science Publishers, Amsterdam, NL, vol. 14, No. 10, Oct. 1, 2005 (Oct. 1, 2005), pp. 1647-1653.
Rockwood Lithium, Spodumene Concentrate SC 7.5 premium, Aug. 2015, pp. 1-2, The Lithium Company.
D.D.L. Chung: "Acid Aluminum Phosphate for the Binding and Coating of Materials", Journal of Materials Science, vol. 38, No. 13, 2003, pp. 2785-2791.
Extended European Search Report dated Nov. 6, 2017 in European Application No. 17174481.6.
Final Office Action dated Jan. 17, 2018 in U.S. Appl. No. 14/671,637.
Communication Pursuant to Article 94(3) dated Jan. 3, 2018 in European Application No. 16161832.7.
Extended European Search Report dated Nov. 20, 2017 in European Application No. 17175809.7.
Extended European Search Report dated Nov. 20, 2017 in European Application No. 17178011.7.
Partial European Search Report dated Jan. 13, 2018 in European Application No. 17183478.1.
Advisory Action dated Mar. 30, 2018 in U.S. Appl. No. 14/671,637.
Non Final Office Action dated May 1, 2018 in U.S. Appl. No. 15/076,348.
Restriction/Election Requirement dated May 24, 2018 in U.S. Appl. No. 15/174,537.
Non Final Office Action dated Mar. 28, 2018 in Application No. 15234903.
European Search Report dated Apr. 11, 2018 in European Application No. 17183478.1-1103.
European Search Report dated Apr. 13, 2018 in European Application No. 17207767.9-1106.
USPTO, Restriction/Election Requirement dated Jun. 19, 2018 in U.S. Appl. No. 15/194,034.
USPTO, Notice of Allowance dated Jun. 5, 2018 in U.S. Appl. No. 14/671,637.
USPTO, Corrected Notice of Allowance dated Jun. 22, 2018 in U.S. Appl. No. 14/671,637.
USPTO, Non Final Office Action dated Jul. 27, 2018 in U.S. Appl. No. 15/174,537.
Steven A. Poteet, et al., U.S. Appl. No. 16/029,134, filed Jul. 6, 2018 titled "High Temperature Oxidation Protection for Composites ," 43 pages.
Steven A. Poteet, et al., U.S. Appl. No. 15/886,671, filed Feb. 1, 2018 titled "High Temperature Oxidation Protection for Composites ," 45 pages.
European Patent Office, European Office Action dated Jul. 16, 2018 in Application No. 17174481.6.
Steven A. Poteet, U.S. Appl. No. 16/102,100, filed Aug. 13, 2018 titled "High Temperature Oxidation Protection for Composites ," 47 pages.
USPTO, Notice of Allowance dated Aug. 24, 2018 in U.S. Appl. No. 14/671,637.

(56) References Cited

OTHER PUBLICATIONS

Anthony Mazany, U.S. Appl. No. 16/116,665, filed Aug. 29, 2018 titled "Formulations for Oxidation Protection of Composite Articles", 30 pages.
USPTO, Restriction/Election Requirement dated Aug. 30, 2018 in U.S. Appl. No. 15/169,219.
USPTO, Restriction/Election Requirement dated Aug. 30, 2018 in U.S. Appl. No. 15/169,257.
USPTO, Final Office Action dated Oct. 26, 2018 in U.S. Appl. No. 15/234,903.
USPTO, Final Office Action dated Nov. 5, 2018 in U.S. Appl. No. 15/076,348.
Steven A. Poteet, U.S. Appl. No. 16/190,817, filed Nov. 14, 2018 titled "High Temperature Oxidation Protection for Composites ," 38 pages.
USPTO, Non-Final Office Action filed Dec. 19, 2018 in U.S. Appl. No. 15/169,219.
USPTO, Non-Final Office Action filed Dec. 19, 2018 in U.S. Appl. No. 15/169,257.
USPTO, Non-Final Office Action filed Dec. 21, 2018 in U.S. Appl. No. 15/194,034.
USPTO, Advisory Action filed Dec. 28, 2018 in U.S. Appl. No. 15/076,348.
USPTO, Advisory Action filed Jan. 17, 2019 in U.S. Appl. No. 15/234,903.
USPTO, Final Office Action filed Feb. 14, 2019 in U.S. Appl. No. 15/174,537.
USPTO, Non-Final Office Action filed Feb. 25, 2019 in U.S. Appl. No. 15/234,903.
USPTO, Non-Final Office Action dated Apr. 16, 2019 in U.S. Appl. No. 15/076,348.
USPTO, Notice of Allowance dated Apr. 3, 2019 in U.S. Appl. No. 15/169,257.
USPTO, Advisory Action dated May 17, 2019 in U.S. Appl. No. 15/174,537.
USPTO, Final Office Action dated May 15, 2019 in U.S. Appl. No. 15/194,034.
USPTO, Restriction/Election Requirement dated Apr. 5, 2019 in U.S. Appl. No. 15/380,442.
USPTO, Non-Final Office Action filed Jun. 7, 2019 in U.S. Appl. No. 15/174,537.
USPTO, Notice of Allowance dated Jun. 17, 2019 in U.S. Appl. No. 15/169,257.
European Patent Office, European Office Action dated Jun. 21, 2019 in Application No. 19155021.9.
USPTO, Notice of Allowance filed Jun. 26, 2019 in U.S. Appl. No. 15/169,219.
USPTO, Pre-Interview First Office Action dated Jul. 26, 2019 in U.S. Appl. No. 15/380,442.
USPTO, Notice of Allowance dated Aug. 13, 2019 in U.S. Appl. No. 15/194,034.
USPTO, Final Office Action filed Aug. 30, 2019 in U.S. Appl. No. 15/234,903.
The National Academics Press, Committee on Advanced Fibers for High-Temperature Ceramic Composites, Ceramic Fibers and Coatings: Advanced Materials for the Twenty-First Century, Chapter 6: Interfacial Coatings, (1998), p. 1-48 (Year: 1998).
European Patent Office, European Search Report dated Aug. 28, 2019 in Application No. 17173707.5.
USPTO, Notice of Allowance dated Feb. 21, 2020 in U.S. Appl. No. 16/116,665.
European Patent Office, European Search Report dated Mar. 23, 2020 in Application No. 19207148.8.
USPTO, Pre-Interview First Office Action dated Apr. 17, 2020 in U.S. Appl. No. 15/886,671.
USPTO, Restriction/Election Requirement dated Apr. 30, 2020 in U.S. Appl. No. 16/029,134.
USPTO, Corrected Notice of Allowance dated May 28, 2020 in U.S. Appl. No. 16/116,665.
USPTO, First Action Interview Office Action dated Jun. 4, 2020 in U.S. Appl. No. 15/886,671.
USPTO, Notice of Allowance dated Sep. 25, 2019 in U.S. Appl. No. 15/380,442.
USPTO, Supplemental Notice of Allowance filed Oct. 2, 2019 in U.S. Appl. No. 15/169,219.
Steven A. Poteet, U.S. Appl. No. 16/666,809, filed Oct. 29, 2019 titled "High Temperature Oxidation Protection for Composites ," 45 pages.
USPTO, Advisory Action filed Nov. 20, 2019 in U.S. Appl. No. 15/234,903.
European Patent Office, European Search Report dated Nov. 25, 2019 in Application No. 19184523.9.
USPTO, Restriction/Election Requirement dated Dec. 13, 2019 in U.S. Appl. No. 15/886,671.
European Patent Office, European Search Report dated Dec. 13, 2019 in Application No. 19191306.0.
USPTO, Notice of Allowance filed May 1, 2020 in U.S. Appl. No. 15/234,903.
USPTO, Corrected Notice of Allowance filed Jul. 9, 2020 in U.S. Appl. No. 15/234,903.
USPTO, Corrected Notice of Allowance filed Aug. 7, 2020 in U.S. Appl. No. 15/234,903.
USPTO, Restriction/Election Requirement filed Jul. 14, 2020 in U.S. Appl. No. 16/102,100.
USPTO, Advisory Action dated Nov. 17, 2020 in U.S. Appl. No. 15/886,671.
USPTO, Non-Final Office Action filed Nov. 17, 2020 in U.S. Appl. No. 16/102,100.
USPTO, Notice of Allowance dated Jan. 1, 2021 in U.S. Appl. No. 16/453,593.
European Patent Office, European Office Action dated Oct. 22, 2020 in Application No. 17173709.1.

* cited by examiner

FIG. 3

HIGH TEMPERATURE OXIDATION PROTECTION FOR COMPOSITES

CROSS REFERENCE TO RELATED APPLICATIONS

This application is a divisional of, claims priority to and the benefit of, U.S. Ser. No. 15/169,219 filed May 31, 2016 and entitled "HIGH TEMPERATURE OXIDATION PROTECTION FOR COMPOSITES," which is hereby incorporated in its entirety for all purposes.

FIELD

The present disclosure relates generally to carbon-carbon composites and, more specifically, to oxidation protection systems for carbon-carbon composite structures.

BACKGROUND

Oxidation protection systems for carbon-carbon composites are typically designed to minimize loss of carbon material due to oxidation at operating conditions, which include temperatures as high as 900° C. (1652° F.). Phosphate-based oxidation protection systems may reduce infiltration of oxygen and oxidation catalysts into the composite structure. However, despite the use of such oxidation protection systems, significant oxidation of the carbon-carbon composites may still occur during operation of components such as, for example, aircraft braking systems.

SUMMARY

A method for coating a composite structure is provided comprising applying a first slurry on a surface of the composite structure, heating the composite structure to a temperature sufficient to form a base layer on the composite structure, forming a sealing slurry comprising an acid aluminum phosphate and/or an orthophosphoric acid, applying the sealing slurry to the base layer, and/or heating the composite structure to a second temperature sufficient to form a sealing layer on the base layer. In various embodiments, the ratio of aluminum to phosphate in the sealing slurry may be between 1 to 2 and 1 to 5.

In various embodiments, the method may further comprise forming the first slurry by combining a first pre-slurry composition with a first carrier fluid, wherein the first pre-slurry composition comprises a first phosphate glass composition and/or an acid aluminum phosphate, wherein a ratio of aluminum to phosphoric acid is between 1 to 2 and 1 to 3. The method may further comprise applying at least one of a pretreating composition or a barrier coating to the composite structure prior to applying the first slurry to the composite structure. The method may further comprise applying a pretreating composition, wherein the pretreating composition may comprise at least one of a phosphoric acid and an acid phosphate salt, an aluminum salt, and an additional salt, and wherein the composite structure may be porous and the pretreating composition may penetrate at least one pore of the composite structure.

In various embodiments, the method may further comprise applying a pretreating composition, wherein the applying comprises applying a first pretreating composition to an outer surface of the composite structure, the first pretreating composition comprising aluminum oxide and water, heating the pretreating composition, and/or applying a second pretreating composition comprising at least one of a phosphoric acid or an acid phosphate salt and an aluminum salt on the first pretreating composition, wherein the composite structure may be porous and the second pretreating composition penetrates at least a pore of the composite structure.

In various embodiments, the barrier coating may comprise at least one of a carbide, a nitride, a boron nitride, a silicon carbide, a titanium carbide, a boron carbide, a silicon oxycarbide, a molybdenum disulfide, a tungsten disulfide, or a silicon nitride. The method may further comprise applying a barrier coating by at least one of reacting the composite structure with molten silicon, spraying, chemical vapor deposition (CVD), molten application, or brushing.

In various embodiments, the first phosphate glass composition may be represented by the formula $a(A'_2O)_x(P_2O_5)_{y1}b(G_fO)_{y2}c(A''O)_z$:

A' is selected from: lithium, sodium, potassium, rubidium, cesium, and mixtures thereof;

$G_f$ is selected from: boron, silicon, sulfur, germanium, arsenic, antimony, and mixtures thereof;

A" is selected from: vanadium, aluminum, tin, titanium, chromium, manganese, iron, cobalt, nickel, copper, mercury, zinc, thulium, lead, zirconium, lanthanum, cerium, praseodymium, neodymium, samarium, europium, gadolinium, terbium, dysprosium, holmium, erbium, thulium, ytterbium, actinium, thorium, uranium, yttrium, gallium, magnesium, calcium, strontium, barium, tin, bismuth, cadmium, and mixtures thereof;

a is a number in the range from 1 to about 5;

b is a number in the range from 0 to about 10;

c is a number in the range from 0 to about 30;

x is a number in the range from about 0.050 to about 0.500;

$y_1$ is a number in the range from about 0.100 to about 0.950;

$y_2$ is a number in the range from 0 to about 0.20; and z is a number in the range from about 0.01 to about 0.5;

$(x+y_1+y_2+z)=1$; and $x<(y_1+y_2)$.

In various embodiments, the sealing slurry may comprise between 60% and 100% by weight acid aluminum phosphate and between 0% and 40% by weight orthophosphoric acid. In various embodiments, the first slurry may comprise a refractory compound such as a nitride, a boron nitride, a silicon carbide, a titanium carbide, a boron carbide, a silicon oxycarbide, silicon nitride, molybdenum disulfide or tungsten disulfide. In various embodiments, the composite structure is a carbon-carbon composite structure. In various embodiments, the first slurry may comprise at least one of a surfactant, a flow modifier, a polymer, ammonium hydroxide, ammonium dihydrogen phosphate, acid aluminum phosphate, nanoplatelets, or graphene nanoplatelets.

In various embodiments, a sealing slurry for application to a composite structure may comprise a phosphate composition comprising at least one of acid aluminum phosphate or orthophosphoric acid. In various embodiments, the phosphate composition may comprise a ratio of aluminum to phosphate of between 1 to 2 and 1 to 5. In various embodiments, the phosphate composition may be substantially free of phosphate glass.

In various embodiments, an article is provided comprising a carbon-carbon composite structure, and an oxidation protection composition including a base layer disposed on an outer surface of the carbon-carbon composite structure and a sealing layer disposed on an outer surface of the base layer, wherein the base layer comprises a first pre-slurry composition, wherein the sealing layer comprises a second phosphate composition comprising a second acid aluminum phosphate and/or orthophosphoric acid.

In various embodiments, the sealing layer may comprise a ratio of aluminum to phosphate of between 1 to 2 and 1 to 5. In various embodiments, the first pre-slurry composition may comprise a first acid aluminum phosphate, wherein the ratio of aluminum to phosphate is between 1 to 2 and 1 to 3. In various embodiments, the second phosphate composition may be substantially free of phosphate glass.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of embodiments herein makes reference to the accompanying drawings, which show embodiments by way of illustration. While these embodiments are described in sufficient detail to enable those skilled in the art to practice the disclosure, it should be understood that other embodiments may be realized and that logical and mechanical changes may be made without departing from the spirit and scope of the disclosure. Thus, the detailed description herein is presented for purposes of illustration only and not for limitation. For example, any reference to singular includes plural embodiments, and any reference to more than one component or step may include a singular embodiment or step. Also, any reference to attached, fixed, connected or the like may include permanent, removable, temporary, partial, full and/or any other possible attachment option.

Figure 1A:
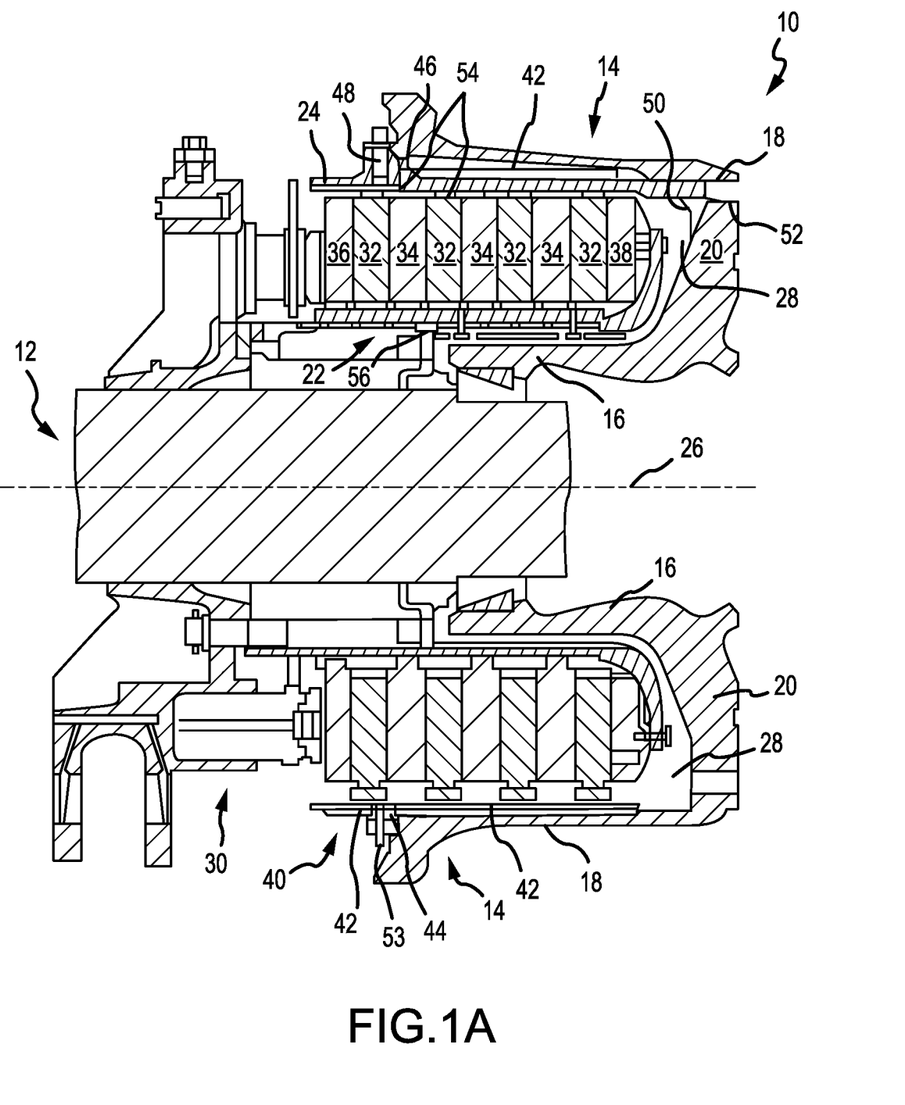
FIG. 1A illustrates a cross sectional view of an aircraft wheel braking assembly, in accordance with various embodiments.
Figure 1B:
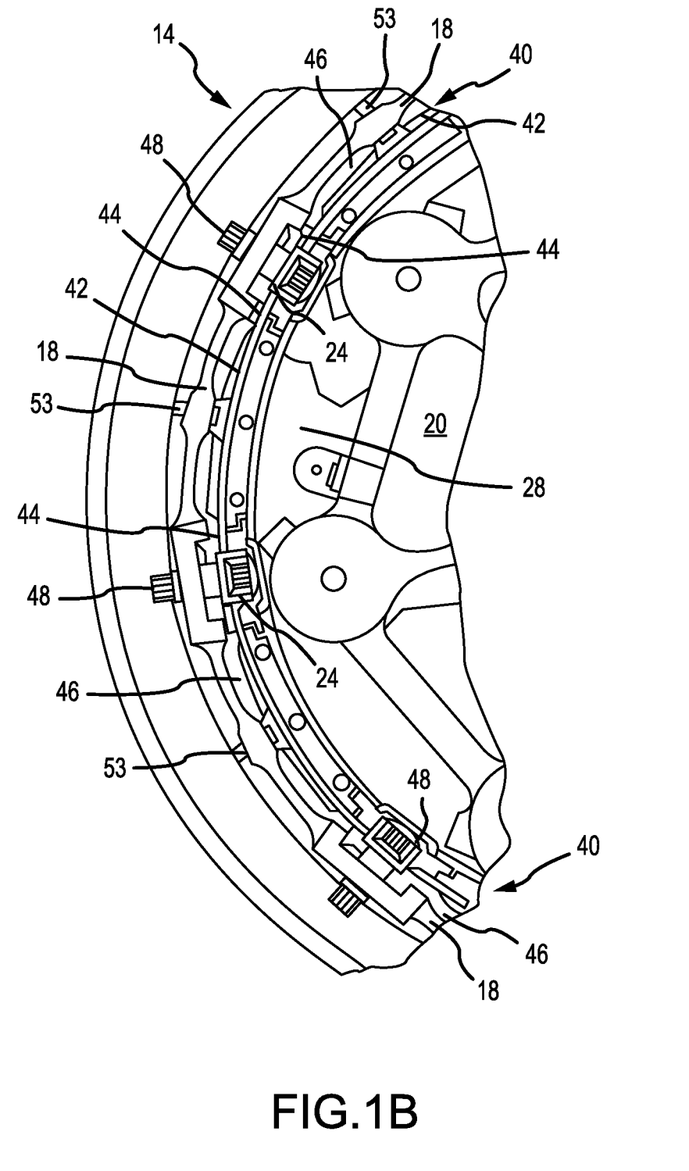
FIG. 1B illustrates a partial side view of an aircraft wheel braking assembly, in accordance with various embodiments.

With initial reference to FIGS. 1A and 1B, aircraft wheel braking assembly 10 such as may be found on an aircraft, in accordance with various embodiments, is illustrated. Aircraft wheel braking assembly 10 may, for example, comprise a bogie axle 12, a wheel 14 including a hub 16 and a wheel well 18, a web 20, a torque take-out assembly 22, one or more torque bars 24, a wheel rotational axis 26, a wheel well recess 28, an actuator 30, multiple brake rotors 32, multiple brake stators 34, a pressure plate 36, an end plate 38, a heat shield 40, multiple heat shield sections 42, multiple heat shield carriers 44, an air gap 46, multiple torque bar bolts 48, a torque bar pin 50, a wheel web hole 52, multiple heat shield fasteners 53, multiple rotor lugs 54, and multiple stator slots 56. FIG. 1B illustrates a portion of aircraft wheel braking assembly 10 as viewed into wheel well 18 and wheel well recess 28.

In various embodiments, the various components of aircraft wheel braking assembly 10 may be subjected to the application of compositions and methods for protecting the components from oxidation.

Brake disks (e.g., interleaved rotors 32 and stators 34) are disposed in wheel well recess 28 of wheel well 18. Rotors 32 are secured to torque bars 24 for rotation with wheel 14, while stators 34 are engaged with torque take-out assembly 22. At least one actuator 30 is operable to compress interleaved rotors 32 and stators 34 for stopping the aircraft. In this example, actuator 30 is shown as a hydraulically actuated piston, but many types of actuators are suitable, such as an electromechanical actuator. Pressure plate 36 and end plate 38 are disposed at opposite ends of the interleaved rotors 32 and stators 34. Rotors 32 and stators 34 can comprise any material suitable for friction disks, including ceramics or carbon materials, such as a carbon/carbon composite.

Through compression of interleaved rotors 32 and stators 34 between pressure plates 36 and end plate 38, the resulting frictional contact slows rotation of wheel 14. Torque take-out assembly 22 is secured to a stationary portion of the landing gear truck such as a bogie beam or other landing gear strut, such that torque take-out assembly 22 and stators 34 are prevented from rotating during braking of the aircraft.

Carbon-carbon composites (also referred to herein as composite structures, composite substrates, and carbon-carbon composite structures, interchangeably) in the friction disks may operate as a heat sink to absorb large amounts of kinetic energy converted to heat during slowing of the aircraft. Heat shield 40 may reflect thermal energy away from wheel well 18 and back toward rotors 32 and stators 34. With reference to FIG. 1A, a portion of wheel well 18 and torque bar 24 is removed to better illustrate heat shield 40 and heat shield segments 42. With reference to FIG. 1B, heat shield 40 is attached to wheel 14 and is concentric with wheel well 18. Individual heat shield sections 42 may be secured in place between wheel well 18 and rotors 32 by respective heat shield carriers 44 fixed to wheel well 18. Air gap 46 is defined annularly between heat shield segments 42 and wheel well 18.

Torque bars 24 and heat shield carriers 44 can be secured to wheel 14 using bolts or other fasteners. Torque bar bolts 48 can extend through a hole formed in a flange or other mounting surface on wheel 14. Each torque bar 24 can optionally include at least one torque bar pin 50 at an end opposite torque bar bolts 48, such that torque bar pin 50 can be received through wheel web hole 52 in web 20. Heat shield sections 42 and respective heat shield carriers 44 can then be fastened to wheel well 18 by heat shield fasteners 53.

Under the operating conditions (e.g., high temperature) of aircraft wheel braking assembly 10, carbon-carbon composites may be prone to material loss from oxidation of the carbon. For example, various carbon-carbon composite components of aircraft wheel braking assembly 10 may experience both catalytic oxidation and inherent thermal oxidation caused by heating the composite during operation. In various embodiments, composite rotors 32 and stators 34 may be heated to sufficiently high temperatures that may oxidize the carbon surfaces exposed to air. At elevated temperatures, infiltration of air and contaminants may cause internal oxidation and weakening, especially in and around brake rotor lugs 54 or stator slots 56 securing the friction disks to the respective torque bar 24 and torque take-out assembly 22. Because carbon-carbon composite components of aircraft wheel braking assembly 10 may retain heat for a substantial time period after slowing the aircraft, oxygen from the ambient atmosphere may react with the carbon matrix and/or carbon fibers to accelerate material loss. Further, damage to brake components may be caused by the oxidation enlargement of cracks around fibers or enlargement of cracks in a reaction-formed porous barrier coating (e.g., a silicon-based barrier coating) applied to the carbon-carbon composite.

Elements identified in severely oxidized regions of carbon-carbon composite brake components include potassium (K) and sodium (Na). These alkali contaminants may come into contact with aircraft brakes as part of cleaning or de-icing materials. Other sources include salt deposits left from seawater or sea spray. These and other contaminants (e.g. Ca, Fe, etc.) can penetrate and leave deposits in pores of carbon-carbon composite aircraft brakes, including the substrate and any reaction-formed porous barrier coating. When such contamination occurs, the rate of carbon loss by oxidation can be increased by one to two orders of magnitude.

In various embodiments, components of aircraft wheel braking assembly 10 may reach operating temperatures in the range from about 100° C. (212° F.) up to about 900° C. (1652° F.). However, it will be recognized that the oxidation protection compositions and methods of the present disclosure may be readily adapted to many parts in this and other braking assemblies, as well as to other carbon-carbon composite structures susceptible to oxidation losses from infiltration of atmospheric oxygen and/or catalytic contaminants.

In various embodiments, a method for limiting an oxidation reaction in a composite structure may comprise forming a slurry by combining a first pre-slurry composition comprising a first phosphate glass composition in the form of a glass frit, powder, or other suitable pulverized form, with a first carrier fluid (such as, for example, water), applying the first slurry to a composite structure, and heating the composite structure to a temperature sufficient to dry the carrier fluid and form an oxidation protection coating on the composite structure, which in various embodiments may be referred to a base layer. The first pre-slurry composition may comprise additives, such as, for example, ammonium hydroxide, ammonium dihydrogen phosphate, nanoplatelets (such as graphene-based nanoplatelets), among others, to improve hydrolytic stability and/or to increase the composite structure's resistance to oxidation, thereby tending to reduce mass loss of composite structure. In various embodiments, a slurry comprising acid aluminum phosphates having an aluminum (Al) to phosphoric acid ($H_3PO_4$) ratio of 1 to 3 or less by weight, such as an Al:$H_3PO_4$ ratio of between 1 to 2 and 1 to 3 by weight, tends to provide increased hydrolytic stability without substantially increasing composite structure mass loss. In various embodiments, a slurry comprising acid aluminum phosphates having an Al:$H_3PO_4$ ratio between 1:2 to 1:3 produces an increase in hydrolytic protection and an unexpected reduction in composite structure mass loss.

Figure 2A:
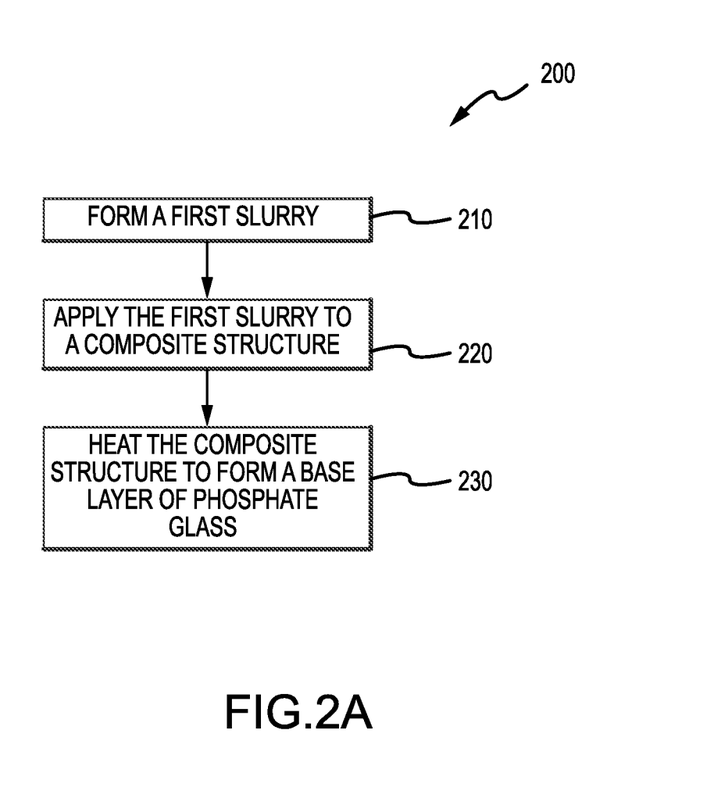
FIGS. 2A, 2B, and 2C illustrate a method for coating a composite structure in accordance with various embodiments.

With initial reference to FIG. 2A, a method 200 for coating a composite structure in accordance with various embodiments is illustrated. Method 200 may, for example, comprise applying an oxidation inhibiting composition to non-wearing surfaces of carbon-carbon composite brake components. In various embodiments, method 200 may be used on the back face of pressure plate 36 and/or end plate 38, an inner diameter (ID) surface of stators 34 including slots 56, as well as outer diameter (OD) surfaces of rotors 32 including lugs 54. The oxidation inhibiting composition of method 200 may be applied to preselected regions of a carbon-carbon composite structure that may be otherwise susceptible to oxidation. For example, aircraft brake disks may have the oxidation inhibiting composition applied on or proximate stator slots 56 and/or rotor lugs 54.

In various embodiments, method 200 may comprise forming a first slurry (step 210) by combining a first pre-slurry composition, which may comprise, among other materials, a first phosphate glass composition, with a first carrier fluid (such as, for example, water). In various embodiments, the first phosphate glass composition may comprise a phosphate glass composition in the form of a glass frit, powder, or other suitable pulverized and/or ground form. In various embodiments, the first slurry may comprise an acid aluminum phosphate wherein the ratio of Al:$H_3PO_4$ may be between 1:2 to 1:3, between 1:2.2 to 1:3, between 1:2.5 to 1:3, between 1:2.7 to 1:3, between 1:2 to 1:2.9, or between 1:2.9 to 1:3, as measured by weight. The first pre-slurry composition may further comprise a boron nitride additive. For example, a boron nitride (such as hexagonal boron nitride) may be added as part of the first pre-slurry composition such that the resulting pre-slurry composition comprises between about 10 weight percent and about 30 weight percent of boron nitride, wherein the term "about" in this context only means plus or minus 5 weight percent. The first pre-slurry composition may comprise all components of the first slurry except the first carrier fluid. Further, the first pre-slurry composition may comprise between about 15 weight percent and 25 weight percent of boron nitride, wherein the term "about" in this context only means plus or minus 5 weight percent. Boron nitride may be prepared for addition to the first phosphate glass composition in the first pre-slurry composition by, for example, ultrasonically exfoliating boron nitride in dimethylformamide (DMF), a solution of DMF and water, or 2-propanol solution. In various embodiments, the boron nitride additive may comprise a boron nitride that has been prepared for addition to the first phosphate glass composition in the first pre-slurry composition by crushing or milling (e.g., ball milling) the boron nitride. The resulting boron nitride may be combined with the first phosphate glass composition glass frit.

The first phosphate glass composition may comprise one or more alkali metal glass modifiers, one or more glass network modifiers and/or one or more additional glass formers. In various embodiments, boron oxide or a precursor may optionally be combined with the $P_2O_5$ mixture to form a borophosphate glass, which has improved self-healing properties at the operating temperatures typically seen in aircraft braking assemblies. In various embodiments, the phosphate glass and/or borophosphate glass may be characterized by the absence of an oxide of silicon. Further, the ratio of $P_2O_5$ to metal oxide in the fused glass may be in the range from about 0.25 to about 5 by weight.

Potential alkali metal glass modifiers may be selected from oxides of lithium, sodium, potassium, rubidium, cesium, and mixtures thereof. In various embodiments, the glass modifier may be an oxide of lithium, sodium, potassium, or mixtures thereof. These or other glass modifiers may function as fluxing agents. Additional glass formers can include oxides of boron, silicon, sulfur, germanium, arsenic, antimony, and mixtures thereof.

Suitable glass network modifiers include oxides of vanadium, aluminum, tin, titanium, chromium, manganese, iron, cobalt, nickel, copper, mercury, zinc, thulium, lead, zirconium, lanthanum, cerium, praseodymium, neodymium, samarium, europium, gadolinium, terbium, dysprosium, holmium, erbium, thulium, ytterbium, actinium, thorium, uranium, yttrium, gallium, magnesium, calcium, strontium, barium, tin, bismuth, cadmium, and mixtures thereof.

The first phosphate glass composition may be prepared by combining the above ingredients and heating them to a fusion temperature. In various embodiments, depending on the particular combination of elements, the fusion temperature may be in the range from about 700° C. (1292° F.) to about 1500° C. (2732° F.). The resultant melt may then be cooled and pulverized and/or ground to form a glass frit or powder. In various embodiments, the first phosphate glass composition may be annealed to a rigid, friable state prior to being pulverized. Glass transition temperature ($T_g$), glass softening temperature ($T_s$) and glass melting temperature ($T_m$) may be increased by increasing refinement time and/or temperature. Before fusion, the first phosphate glass composition comprises from about 20 mol % to about 80 mol % of $P_2O_5$. In various embodiments, the first phosphate glass composition comprises from about 30 mol % to about 70 mol % of $P_2O_5$, or precursor thereof. In various embodiments, the first phosphate glass composition comprises from about 40 mol % to about 60 mol % of $P_2O_5$. As used in this context only, the term "about" means plus or minus 5 mol %.

The first phosphate glass composition may comprise from about 5 mol % to about 50 mol % of the alkali metal oxide. In various embodiments, the first phosphate glass composition comprises from about 10 mol % to about 40 mol % of the alkali metal oxide. Further, the first phosphate glass composition may comprise from about 15 mol % to about 30 mol % of the alkali metal oxide or one or more precursors thereof. In various embodiments, the first phosphate glass composition may comprise from about 0.5 mol % to about 50 mol % of one or more of the above-indicated glass formers. The first phosphate glass composition may comprise about 5 to about 20 mol % of one or more of the above-indicated glass formers. As used herein, mol % is defined as the number of moles of a constituent per the total moles of the solution.

In various embodiments, the first phosphate glass composition may comprise from about 0.5 mol % to about 40 mol % of one or more of the above-indicated glass network modifiers. The first phosphate glass composition may comprise from about 2.0 mol % to about 25 mol % of one or more of the above-indicated glass network modifiers.

In various embodiments, the first phosphate glass composition may represented by the formula:

$$a(A'_2O)_x(P_2O_5)_{y1}b(G_fO)_{y2}c(A''O)_z \qquad [1]$$

In Formula 1, A' is selected from: lithium, sodium, potassium, rubidium, cesium, and mixtures thereof; $G_f$ is selected from: boron, silicon, sulfur, germanium, arsenic, antimony, and mixtures thereof; A" is selected from: vanadium, aluminum, tin, titanium, chromium, manganese, iron, cobalt, nickel, copper, mercury, zinc, thulium, lead, zirconium, lanthanum, cerium, praseodymium, neodymium, samarium, europium, gadolinium, terbium, dysprosium, holmium, erbium, thulium, ytterbium, actinium, thorium, uranium, yttrium, gallium, magnesium, calcium, strontium, barium, tin, bismuth, cadmium, and mixtures thereof; a is a number in the range from 1 to about 5; b is a number in the range from 0 to about 10; c is a number in the range from 0 to about 30; x is a number in the range from about 0.050 to about 0.500; $y_1$ is a number in the range from about 0.100 to about 0.950; $y_2$ is a number in the range from 0 to about 0.20; and z is a number in the range from about 0.01 to about 0.5; $(x+y_1+y_2+z)=1$; and $x<(y_1+y_2)$. The first phosphate glass composition may be formulated to balance the reactivity, durability and flow of the resulting glass barrier layer for optimal performance.

In various embodiments, first phosphate glass composition in glass frit form may be combined with additional components to form the first pre-slurry composition. For example, crushed first phosphate glass composition in glass frit form may be combined with ammonium hydroxide, ammonium dihydrogen phosphate, nanoplatelets (such as graphene-based nanoplatelets), among others. For example, graphene nanoplatelets could be added to the first phosphate glass composition in glass frit form. In various embodiments, the additional components may be combined and preprocessed before combining them with first phosphate glass composition in glass frit form. Other suitable additional components include, for example, surfactants such as, for example, an ethoxylated low-foam wetting agent and flow modifiers, such as, for example, polyvinyl alcohol, polyacrylate, or similar polymers. In various embodiments, other suitable additional components may include additives to enhance impact resistance and/or to toughen the barrier coating, such as, for example, at least one of whiskers, nanofibers or nanotubes consisting of nitrides, carbides, carbon, graphite, quartz, silicates, aluminosilicates, phosphates, and the like. In various embodiments, additives to enhance impact resistance and/or to toughen the barrier coating may include silicon carbide whiskers, carbon nanofibers, boron nitride nanotubes and similar materials known to those skilled in the art.

In various embodiments, method 200 further comprises applying the first slurry to a composite structure (step 220). Applying the first slurry may comprise, for example, spraying or brushing the first slurry of the first phosphate glass composition onto an outer surface of the composite structure. Any suitable manner of applying the base layer to the composite structure is within the scope of the present disclosure. As referenced herein, the composite structure may refer to a carbon-carbon composite structure.

In various embodiments, method 200 further comprises a step 230 of heating the composite structure to form a base layer of phosphate glass. The composite structure may be heated (e.g., dried or baked) at a temperature in the range from about 200° C. (292° F.) to about 1000° C. (1832° F.). In various embodiments, the composite structure is heated to a temperature in a range from about 600° C. (1112° F.) to about 1000° C. (1832° F.), or between about 200° C. (292° F.) to about 900° C. (1652° F.), or further, between about 400° C. (752° F.) to about 850° C. (1562° F.). Step 230 may, for example, comprise heating the composite structure for a period between about 0.5 hour and about 8 hours, wherein the term "about" in this context only means plus or minus 0.25 hours. The base layer may also be referred to as a coating.

In various embodiments, the composite structure may be heated to a first, lower temperature (for example, about 30° C. (86° F.) to about 400° C. (752° F.)) to bake or dry the base layer at a controlled depth. A second, higher temperature (for example, about 300° C. (572° F.) to about 1000° C. (1832° F.)) may then be used to form a deposit from the base layer within the pores of the composite structure. The duration of each heating step can be determined as a fraction of the overall heating time and can range from about 10% to about 50%, wherein the term "about" in this context only means plus or minus 5%. In various embodiments, the duration of the lower temperature heating step(s) can range from about 20% to about 40% of the overall heating time, wherein the term "about" in this context only means plus or minus 5%. The lower temperature step(s) may occupy a larger fraction of the overall heating time, for example, to provide relatively slow heating up to and through the first lower temperature. The exact heating profile will depend on a combination of the first temperature and desired depth of the drying portion.

Step 230 may be performed in an inert environment, such as under a blanket of inert gas or less reactive gas (e.g., nitrogen, argon, other noble gases, and the like). For example, a composite structure may be pretreated or warmed prior to application of the base layer to aid in the penetration of the base layer. Step 230 may be for a period of about 2 hours at a temperature of about 600° C. (1112° F.) to about 800° C. (1472° F.), wherein the term "about" in this context only means plus or minus 10° C. The composite structure and base layer may then be dried or baked in a non-oxidizing, inert or less reactive atmosphere, e.g., noble gasses and/or nitrogen ($N_2$), to optimize the retention of the first phosphate glass composition of the base layer in the pores of the composite structure. This retention may, for example, be improved by heating the composite structure to about 200° C. (392° F.) and maintaining the temperature for about 1 hour before heating the carbon-carbon composite to a temperature in the range described above. The temperature rise may be controlled at a rate that removes water without boiling, and provides temperature uniformity throughout the composite structure.

Figure 2B:
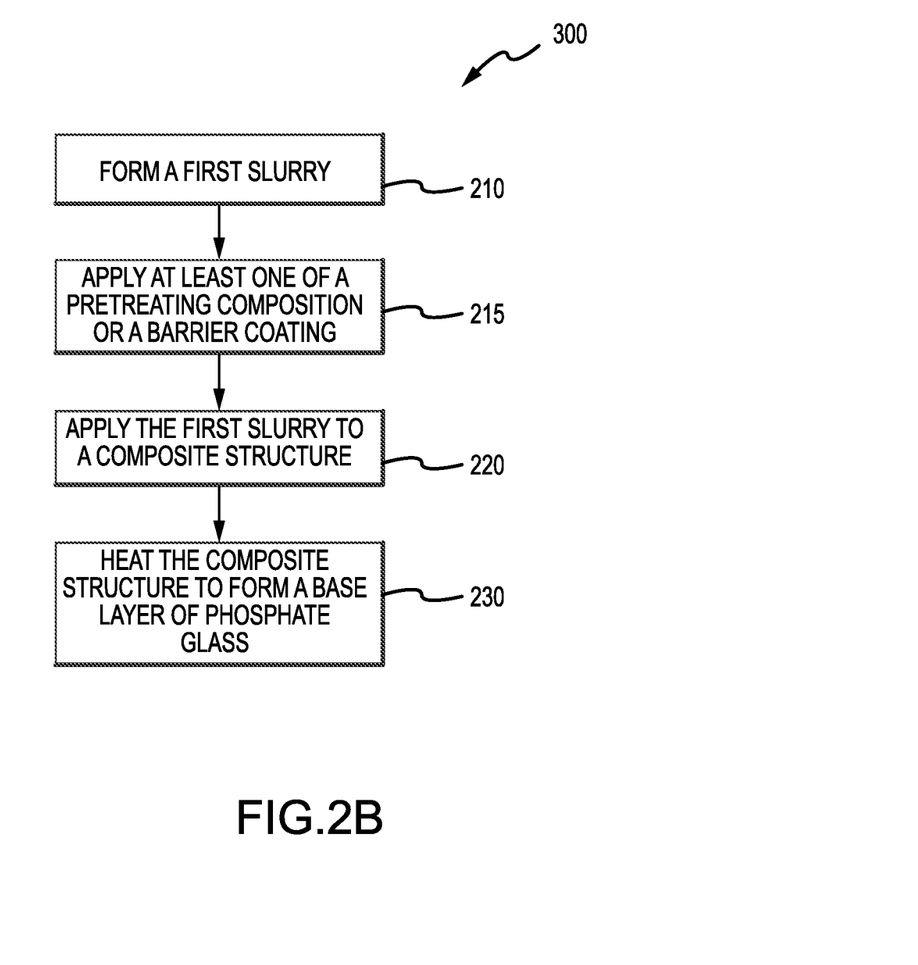

In various embodiments and with reference now to FIG. 2B, method 300, which comprises steps also found in method 200, may further comprise applying at least one of a pretreating composition or a barrier coating (step 215) prior to applying the first slurry. Step 215 may, for example, comprise applying a first pretreating composition to an outer surface of a composite structure, such as a component of aircraft wheel braking assembly 10. In various embodiments, the first pretreating composition comprises an aluminum oxide in water. For example, the aluminum oxide may comprise an additive, such as a nanoparticle dispersion of aluminum oxide (for example, NanoBYK-3600®, sold by BYK Additives & Instruments). The first pretreating composition may further comprise a surfactant or a wetting agent. The composite structure may be porous, allowing the pretreating composition to penetrate at least a portion of the pores of the composite structure.

In various embodiments, after applying the first pretreating composition, the component is heated to remove water and fix the aluminum oxide in place. For example, the component may be heated between about 100° C. (212° F.) and 200° C. (392° F.), and further, between 100° C. (212° F.) and 150° C. (302° F.).

Step 215 may further comprise applying a second pretreating composition. In various embodiments, the second pretreating composition comprises a phosphoric acid and an aluminum phosphate, aluminum hydroxide, or aluminum oxide. The second pretreating composition may further comprise, for example, a second metal salt such as a magnesium salt. In various embodiments, the aluminum to phosphorus ratio of the aluminum phosphate is 1 to 3 or less by weight. Further, the second pretreating composition may also comprise a surfactant or a wetting agent. In various embodiments, the second pretreating composition is applied to the composite structure atop the first pretreating composition. The composite structure may then, for example, be heated. In various embodiments, the composite structure may be heated between about 600° C. (1112° F.) and about 800° C. (1472° F.), and further, between about 650° C. (1202° F.) and 750° C. (1382° F.).

Step 215 may further comprise applying a barrier coating to an outer surface of a composite structure, such as a component of aircraft wheel braking assembly 10. In various embodiments the barrier coating composition may comprise carbides or nitrides, including at least one of a boron nitride, silicon carbide, titanium carbide, boron carbide, silicon oxycarbide, and silicon nitride. In various embodiments the barrier coating composition may comprise a disulfide compounds, such as molybdenum disulfide and/or tungsten disulfide. In various embodiments, the barrier coating may be formed by treating the composite structure with molten silicon. The molten silicon is reactive and may form a silicon carbide barrier on the composite structure. Step 215 may comprise, for example, application of the barrier coating by spraying, chemical vapor deposition (CVD), molten application, or brushing the barrier coating composition on to the outer surface of the carbon-carbon composite structure. Any suitable manner of applying the base layer to composite structure is within the scope of the present disclosure.

Figure 2C:
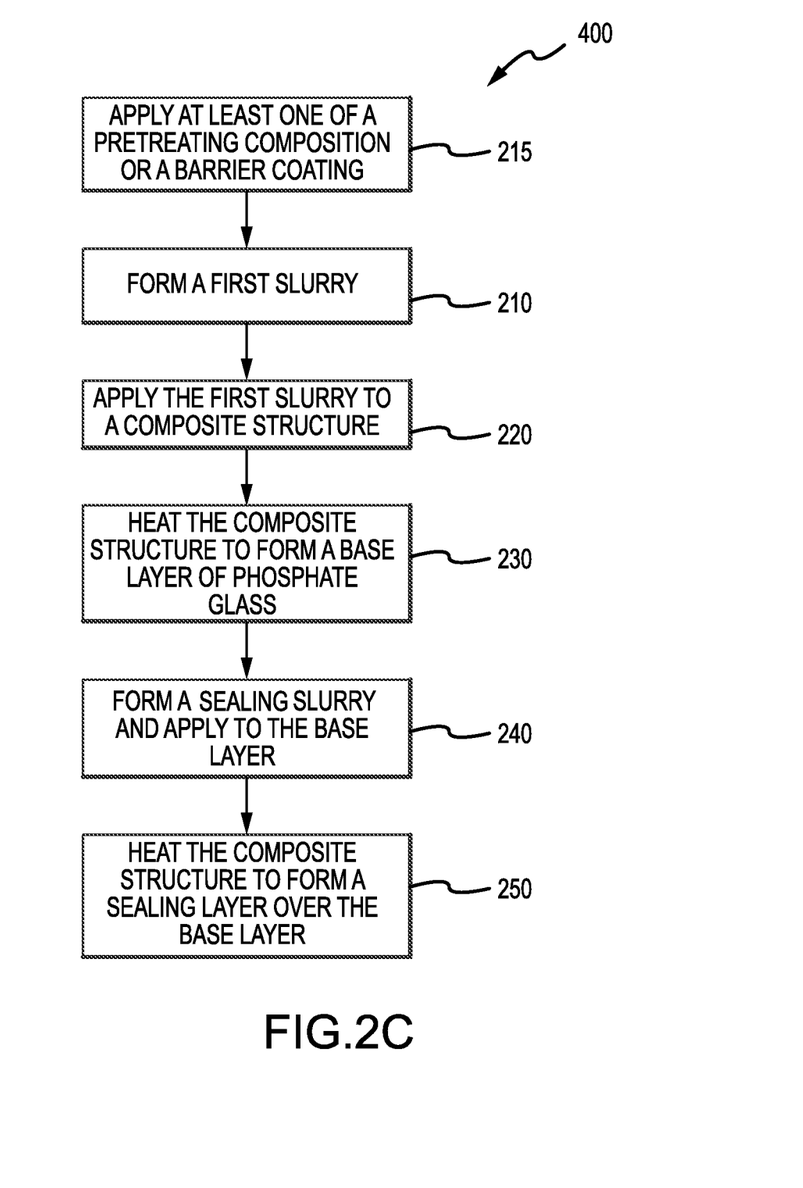

In various embodiments and with reference now to FIG. 2C, method 400 may further comprise a step 240 of forming a sealing slurry. The sealing slurry may comprise a second phosphate composition comprising acid aluminum phosphate and/or orthophosphoric acid. In various embodiments, the second phosphate composition may be combined with a second carrier fluid (such as, for example, water). In various embodiments, the acid aluminum phosphate in the sealing slurry may be diluted by 50% in water, for example, before the addition of orthophosphoric acid. In various embodiments, the second phosphate composition is substantially free of phosphate glass. In this case, "substantially free" means less than 0.01 percent by weight. In various embodiments, the sealing slurry may comprise a mixture of acid aluminum phosphate and orthophosphoric acid wherein the ratio of aluminum (Al) to phosphate ($PO_4^{3-}$) may be between 1:2 to 1:5, between 1:2 to 1:3, between 1:3 to 1:4.5, or between 1:3.5 to 1:4. In various embodiments, the second phosphate composition in the sealing slurry may comprise between about 60% and 100% by weight acid aluminum phosphate and between 0% and about 40% by weight orthophosphoric acid. In various embodiments, the second phosphate composition in the sealing slurry may comprise between about 70% by weight to about 90% by weight acid aluminum phosphate and about 10% by weight to about 30% by weight orthophosphoric acid. In various embodiments, the second phosphate composition in the sealing slurry may comprise about 75% by weight acid aluminum phosphate and about 25% by weight orthophosphoric acid. As used in this context only, the term "about" means plus or minus 5% weight percent. In various embodiments, the acid aluminum phosphate may comprise a ratio of Al:$PO_4^{3-}$ of between 1:2 and 1:3.5. Step 240 may further comprise spraying or brushing the sealing slurry on to an outer surface of the base layer. Any suitable manner of applying the sealing layer to the base layer is within the scope of the present disclosure.

In various embodiments, the sealing slurry and/or the first slurry may comprise an additional metal salt. The cation of the additional metal salt may be multivalent. The metal may be an alkaline earth metal or a transition metal. In various embodiments, the metal may be an alkali metal. The multivalent cation may be derived from a non-metallic element such as boron. The term "metal" is used herein to include multivalent elements such as boron that are technically non-metallic. The metal of the additional metal salt may be an alkaline earth metal such as calcium, magnesium, strontium, barium, or a mixture of two or more thereof. The metal for the additional metal salt may be iron, manganese, tin, zinc, or a mixture of two or more thereof. The anion for the additional metal salt may be an inorganic anion such as a phosphate, halide, sulfate or nitrate, or an organic anion such as acetate. In one embodiment, the additional metal salt may be an alkaline earth metal salt such as an alkaline earth metal phosphate. In one embodiment, the additional metal salt may be a magnesium salt such as magnesium phosphate. In one embodiment, the additional metal salt may be an alkaline earth metal nitrate, an alkaline earth metal halide, an alkaline earth metal sulfate, an alkaline earth metal acetate, or a mixture of two or more thereof. In one embodiment, the additional metal salt may be magnesium nitrate, magnesium halide, magnesium sulfate, or a mixture of two or more thereof. In one embodiment, the additional metal salt may comprise: (i) magnesium phosphate; and (ii) a magnesium nitrate, magnesium halide, magnesium sulfate, or a mixture of two or more thereof.

The additional metal salt may be selected with reference to its compatibility with other ingredients in the sealing slurry and/or the first slurry. Compatibility may include metal phosphates that do not precipitate, flocculate, agglomerate, react to form undesirable species, or settle out prior to application of the sealing slurry and/or the first slurry to the carbon-carbon composite. The phosphates may be monobasic ($H_2PO_4^-$), dibasic ($HPO_4^{-2}$), or tribasic ($PO_4^{-3}$). The phosphates may be hydrated. Examples of alkaline earth metal phosphates that may be used include calcium hydrogen phosphate (calcium phosphate, dibasic), calcium phosphate tribasic octahydrate, magnesium hydrogen phosphate (magnesium phosphate, dibasic), magnesium phosphate tribasic octahydrate, strontium hydrogen phosphate (strontium phosphate, dibasic), strontium phosphate tribasic octahydrate and barium phosphate.

In one embodiment, a chemical equivalent of the additional metal salt may be used as the additional metal salt. Chemical equivalents include compounds that yield an equivalent (in this instance, an equivalent of the additional metal salt) in response to an outside stimulus such as, temperature, hydration, or dehydration. For example, equivalents of alkaline earth metal phosphates may include alkaline earth metal pyrophosphates, hypophosphates, hypophosphites and orthophosphites. Equivalent compounds include magnesium and barium pyrophosphate, magnesium and barium orthophosphate, magnesium and barium hypophosphate, magnesium and barium hypophosphite, and magnesium and barium orthophosphite.

While not wishing to be bound by theory, it is believed that the addition of multivalent cations, such as alkaline earth metals, transition metals and nonmetallic elements such as boron, to the sealing slurry and/or the first slurry enhances the hydrolytic stability of the metal-phosphate network. In general, the hydrolytic stability of the metal-phosphate network increases as the metal content increases, however a change from one metallic element to another may influence oxidation inhibition to a greater extent than a variation in the metal-phosphate ratio. The solubility of the phosphate compounds may be influenced by the nature of the cation associated with the phosphate anion. For example, phosphates incorporating monovalent cations such as sodium orthophosphate or phosphoric acid (hydrogen cations) are very soluble in water while (tri)barium orthophosphate is insoluble. Phosphoric acids can be condensed to form networks but such compounds tend to remain hydrolytically unstable. Generally, it is believed that the multivalent cations link phosphate anions creating a phosphate network with reduced solubility. Another factor that may influence hydrolytic stability is the presence of —P—O—H groups in the condensed phosphate product formed from the sealing slurry and/or the first slurry during thermal treatment. The sealing slurry and/or the first slurry may be formulated to minimize concentration of these species and any subsequent hydrolytic instability. Whereas increasing the metal content may enhance the hydrolytic stability of the sealing slurry and/or the first slurry, it may be desirable to strike a balance between composition stability and effectiveness as an oxidation inhibitor.

In various embodiments, the additional metal salt may be present in the sealing slurry and/or the first slurry at a concentration in the range from about 0.5 weight percent to about 30 weight percent, and in various embodiments from about 0.5 weight percent to about 25 weight percent, and in various embodiments from about 5 weight percent to about 20 weight percent. In various embodiments, a combination of two or more additional metal salts may be present at a concentration in the range from about 10 weight percent to about 30 weight percent, and in various embodiments from about 12 weight percent to about 20 weight percent. In various embodiments comprising the additional metal salt, the sealing slurry may comprise an aluminum to phosphate ratio between 1:2 and 1:5. In various embodiments comprising the additional metal salt, the sealing slurry may comprise a metal to phosphate ratio between 1:2 and 1:5, wherein "metal" in this context only means a combination of aluminum and any of the metals comprised in the additional metal salts, as described herein.

Method 400 may further comprise a step 250 of heating the composite structure to form a sealing layer of phosphate glass over the base layer. The sealing slurry applied to the composite structure may form the sealing layer in response to being heated. Similar to step 230, the composite structure may be heated at a temperature sufficient to adhere the sealing layer to the base layer by, for example, drying or baking the carbon-carbon composite structure at a temperature in the range from about 200° C. (392° F.) to about 1000° C. (1832° F.). In various embodiments, the composite structure is heated to a temperature in a range from about 600° C. (1112° F.) to about 1000° C. (1832° F.), or between about 200° C. (392° F.) to about 900° C. (1652° F.), or further, between about 400° C. (752° F.) to about 850° C. (1562° F.), wherein in this context only, the term "about" means plus or minus 10° C. Further, step 250 may, for example, may comprise heating the composite structure for a period between about 0.5 hour and about 8 hours, where the term "about" in this context only means plus or minus 0.25 hours.

In various embodiments, step 250 may comprise heating the composite structure to a first, lower temperature (for example, about 30° C. (86° F.) to about 300° C. (572° F.)) followed by heating at a second, higher temperature (for example, about 300° C. (572° F.) to about 1000° C. (1832° F.)). The term "about" means plus or minus 10° C. Further, step 250 may be performed in an inert environment, such as under a blanket of inert or less reactive gas (e.g., nitrogen, argon, other noble gases, and the like).

TABLE 1 illustrates a variety of slurries comprising phosphate compositions and prepared in accordance with various embodiments. Each numerical value in TABLE 1 is the number of grams of the particular substance added to the slurry.

TABLE 1

|  | Example | | | | | | |
| --- | --- | --- | --- | --- | --- | --- | --- |
|  | A | B | C | D | E | F | G |
| h-Boron nitride powder A | 0 | 8.75 | 8.75 | 8.25 | 8.25 | 8.25 | 8.25 |
| h-Boron nitride powder B | 0 | 0 | 0 | 0.50 | 0.50 | 0.50 | 0.50 |
| Graphene nanoplatelets | 0 | 0.15 | 0.15 | 0.15 | 0.15 | 0.15 | 0.15 |
| $H_2O$ | 0 | 50.00 | 50.00 | 45.00 | 45.00 | 60.00 | 60.00 |
| Surfynol 465 surfactant | 0 | 0.20 | 0.20 | 0.20 | 0.20 | 0.20 | 0.20 |
| Ammonium dihydrogen phosphate (ADHP) | 0 | 0 | 0 | 0 | 0 | 0 | 0.50 |
| $NH_4OH$ | 0 | 0.50 | 0 | 0.50 | 0.50 | 0.5 | 0 |
| Glass frit | 0 | 26.50 | 26.50 | 26.50 | 26.50 | 26.50 | 26.50 |
| Acid aluminum phosphate (1:3.3 Al-P) | 75.00 | 0 | 0 | 0 | 0 | 0 | 0 |
| Acid aluminum phosphate (1:3 Al-P) | 0 | 0 | 0 | 10.00 | 0 | 0 | 0 |
| Acid aluminum phosphate (1:2.5 Al-P) | 0 | 0 | 0 | 0 | 0 | 0 | 5.00 |
| Acid aluminum phosphate (1:2.1 Al-P) | 0 | 0 | 0 | 0 | 0 | 5.00 | 0 |
| Acid aluminum phosphate (1:2 Al-P) | 0 | 0 | 0 | 0 | 10.00 | 0 | 0 |
| Ammonium dihydrogen phosphate (ADHP) | 0 | 0 | 0.50 | 0 | 0 | 0 | 0 |
| Orthophosphoric acid | 25.00 | 0 | 0 | 0 | 0 | 0 | 0 |

Slurry A may be a phosphate composition comprising no phosphate glass. For example, slurry A may be suitable sealing slurry to create a suitable sealing layer, such as the sealing layer applied in step 240 of method 400. Slurry A may have an aluminum to phosphate ratio of about 1:5. Slurries B-G may comprise boron nitride-containing phosphate glass. For example, slurries B-G may illustrate suitable first slurries to create base layers after heating, such as first slurries applied in step 220 of methods 200, 300, and 400. As illustrated, the boron nitride content of pre-slurry compositions of slurries B-G (all components except for the water) varies between about 17.53 and 28.09 weight percent boron nitride. However, any suitable boron nitride-containing phosphate glass (as described above) is in accordance with the present disclosure.

Figure 3:
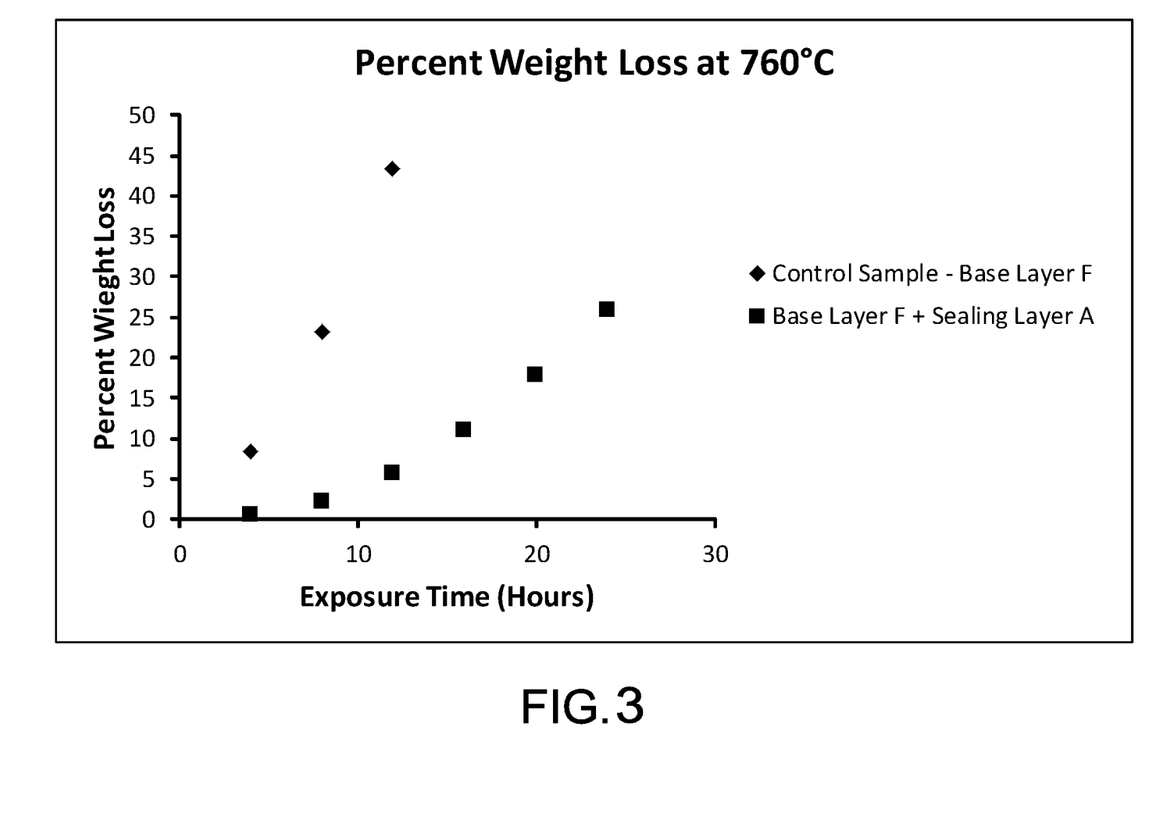
FIG. 3 illustrates experimental data obtained from testing various oxidation protection slurries in accordance with various embodiments at 760° C. (1400° F.).

With reference to FIG. 3 and Table 2 (below), experimental data obtained from testing various glass compositions in accordance with various embodiments is illustrated.

TABLE 2

| | | Base Layer | |
| --- | --- | --- | --- |
| | | F | F |
| | | | Sealing Layer |
| Oxidation Temp | Exposure Time (Hours) | (none) Percentage Weight Loss | A |
| 760 Degrees C. | 0 | 0.00 | 0.00 |
| | 4 | 8.34 | 0.50 |
| | 8 | 23.10 | 2.15 |
| | 12 | 43.35 | 5.55 |
| | 16 | — | 11.03 |
| | 20 | — | 17.82 |
| | 24 | — | 25.84 |

As illustrated in TABLE 1, oxidation protection system slurries comprising a first pre-slurry composition in a carrier fluid (i.e., water), wherein the slurries may include various additives including h-boron nitride, graphene nanoplatelets, a surfactant, a flow modifier such as, for example, polyvinyl alcohol, polyacrylate or similar polymer, ammonium dihydrogen phosphate, ammonium hydroxide, and acid aluminum phosphates with $Al:H_3PO_4$ ratios of between 1 to 2 and 1 to 3 by weight were prepared. For example, slurry example F contained h-boron nitride and an acid aluminum phosphate solution with an aluminum to phosphorus ratio of 1:2.1. Slurry F was applied to 50 gram carbon-carbon composite structure coupons and cured in inert atmosphere under heat at 899° C. (1650° F.). After cooling, sealing slurry (slurry A) was applied atop the cured base layer and the coupons were fired again in an inert atmosphere.

With reference to TABLE 2 and FIG. 3, the performance of the sealing slurry A, which creates a sealing layer in response to being heated in step 250, applied to a composite structure according to various embodiments is illustrated in comparison with a control. The control includes a pretreated composite structure having only base layer F. Percent weight loss is shown in the y-axis and exposure time in hours is shown in the x-axis. Against the control, the addition of the sealing slurry A reduces mass losses due to oxidation by between five times to over ten times (i.e., an order of magnitude). After 12 hours at 760° C. (1400° F.) the control had lost 43.35% of its mass in comparison to the composite structure with base layer F and sealing layer A, which lost only 5.55% of its mass. The effect of adding a sealing slurry to the composite structure comprising acid aluminum phosphate and orthophosphoric acid wherein the ratio of $Al:PO_4$ is between about 1:2 and 1:5 provides an unexpected increase in protection over standalone pretreatment of the carbon-carbon composite structure followed by application of only a base layer. Sealing slurries, such as those described herein, that form sealing layers after heat treatment, such as during step 250 in method 200, allow oxidation protection for composite structures without the material and processing costs associated with the use of glass frit.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for coating a composite structure, comprising:
   applying a first slurry on a surface of the composite structure;
   heating the composite structure to a temperature sufficient to form a base layer on the composite structure;
   forming a sealing slurry comprising an orthophosphoric acid;
   applying the sealing slurry to the base layer; and
   heating the composite structure to a second temperature sufficient to form a sealing layer on the base layer.

2. The method of claim 1, wherein a ratio of aluminum to phosphate in the sealing slurry is between 1 to 2 and 1 to 5.

3. The method of claim 1, further comprising forming the first slurry by combining a first pre-slurry composition with a first carrier fluid, wherein the first pre-slurry composition comprises a first phosphate glass composition, and wherein a ratio of aluminum to phosphoric acid in the first slurry is between 1 to 2 and 1 to 3.

4. The method of claim 1, further comprising applying at least one of a pretreating composition or a barrier coating to the composite structure prior to applying the first slurry to the composite structure.

5. The method of claim 1, further comprising applying a pretreating composition, wherein the pretreating composition comprises at least one of a phosphoric acid and an acid phosphate salt, an aluminum salt, and an additional salt, and wherein the composite structure is porous and the pretreating composition penetrates at least one pore of the composite structure.

6. The method of claim 1, further comprising applying a pretreating composition, wherein the applying comprises:
   applying a first pretreating composition to an outer surface of the composite structure, the first pretreating composition comprising aluminum oxide and water,
   heating the pretreating composition; and
   applying a second pretreating composition comprising at least one of a phosphoric acid or an acid phosphate salt and an aluminum salt on the first pretreating composition, wherein the composite structure is porous and the second pretreating composition penetrates at least a pore of the composite structure.

7. The method of claim 4, wherein the barrier coating comprises at least one of a carbide, a nitride, a boron nitride, a silicon carbide, a titanium carbide, a boron carbide, a silicon oxycarbide, a molybdenum disulfide, a tungsten disulfide, or a silicon nitride.

8. The method of claim 1, further comprising applying a barrier coating by at least one of reacting the composite structure with molten silicon, spraying, chemical vapor deposition (CVD), molten application, or brushing.

9. The method of claim 3, wherein the first phosphate glass composition is represented by the formula $a(A'_2O)_x(P_2O_5)_{y1}b(G_fO)_{y2}c(A''O)_z$:
   A' is selected from: lithium, sodium, potassium, rubidium, cesium, and mixtures thereof;
   $G_f$ is selected from: boron, silicon, sulfur, germanium, arsenic, antimony, and mixtures thereof;
   A" is selected from: vanadium, aluminum, tin, titanium, chromium, manganese, iron, cobalt, nickel, copper, mercury, zinc, thulium, lead, zirconium, lanthanum, cerium, praseodymium, neodymium, samarium, europium, gadolinium, terbium, dysprosium, holmium, erbium, thulium, ytterbium, actinium, thorium, uranium, yttrium, gallium, magnesium, calcium, strontium, barium, tin, bismuth, cadmium, and mixtures thereof;
   a is a number in the range from 1 to about 5;
   b is a number in the range from 0 to about 10;
   c is a number in the range from 0 to about 30;
   x is a number in the range from about 0.050 to about 0.500;
   $y_1$ is a number in the range from about 0.100 to about 0.950;
   $y_2$ is a number in the range from 0 to about 0.20; and
   z is a number in the range from about 0.01 to about 0.5;
   $(x+y_1+y_2+z)=1$; and
   $x<(y_1+y_2)$.

10. The method of claim 1, wherein the sealing slurry comprises between 60% and 100% by weight acid aluminum phosphate and between 0% and 40% by weight orthophosphoric acid.

11. The method of claim 1, wherein the first slurry comprises a refractory compound such as a nitride, a boron nitride, a silicon carbide, a titanium carbide, a boron carbide, a silicon oxycarbide, silicon nitride, molybdenum disulfide or tungsten disulfide.

12. The method of claim 1, wherein the first slurry comprises at least one of a surfactant, a flow modifier, a polymer, ammonium hydroxide, ammonium dihydrogen phosphate, acid aluminum phosphate, nanoplatelets, or graphene nanoplatelets.

13. The method of claim 1, wherein the composite structure is a carbon-carbon composite.

14. A sealing slurry for application to a composite structure, comprising:
   a phosphate composition comprising an acid aluminum phosphate and an orthophosphoric acid.

15. The sealing slurry of claim 14, wherein the phosphate composition comprises a ratio of aluminum to phosphate of between 1 to 2 and 1 to 5.

16. The sealing slurry of claim 14, wherein the phosphate composition is substantially free of phosphate glass.

17. An article comprising:
- a carbon-carbon composite structure; and
- an oxidation protection composition including a base layer disposed on an outer surface of the carbon-carbon composite structure and a sealing layer disposed on an outer surface of the base layer,
- wherein the base layer comprises a first pre-slurry composition,
- wherein the sealing layer comprises a second phosphate composition comprising an orthophosphoric acid.

18. The article of claim 17, wherein the sealing layer comprises a ratio of aluminum to phosphate of between 1 to 2 and 1 to 5.

19. The article of claim 17, wherein the first pre-slurry composition comprises a first acid aluminum phosphate, wherein the ratio of aluminum to phosphate in the first pre-slurry composition is between 1 to 2 and 1 to 3.

20. The article of claim 17, wherein the second phosphate composition is substantially free of phosphate glass.

* * * * *